United States Patent [19]

Aimer et al.

[11] Patent Number: 5,043,999
[45] Date of Patent: Aug. 27, 1991

[54] CIRCUIT ARRANGEMENT FOR DIGITALLY SETTING THE GAIN OF A DIGITALLY ADJUSTABLE RECEIVE AMPLIFIER

[75] Inventors: Michael Aimer, Bruckmuehl; Karl Besemer, Planegg, both of Fed. Rep. of Germany

[73] Assignee: Siemens Aktiengesellschaft, Munich, Fed. Rep. of Germany

[21] Appl. No.: 482,762

[22] Filed: Feb. 21, 1990

[30] Foreign Application Priority Data

Feb. 27, 1989 [EP] European Pat. Off. ........ 89103422.5

[51] Int. Cl.$^5$ .................. H04L 25/30; H04L 27/08
[52] U.S. Cl. ................................. 375/98; 455/239; 455/240; 455/234
[58] Field of Search ............... 375/98, 12, 14, 16, 375/76; 455/239, 240, 245, 246, 232, 234; 330/278, 282; 328/146, 147, 173, 175; 329/350

[56] References Cited

U.S. PATENT DOCUMENTS

| | | | |
|---|---|---|---|
| 4,301,445 | 11/1981 | Robinson | 375/98 X |
| 4,581,731 | 4/1986 | Tomlkashl | 370/4 |
| 4,613,973 | 9/1986 | Dahl | 375/37 |
| 4,637,064 | 1/1987 | Roberts et al. | 375/98 X |
| 4,707,840 | 11/1987 | Nakayama | 575/14 |
| 4,768,204 | 8/1988 | Zeiss | 375/12 |
| 4,829,593 | 5/1989 | Hara | 455/234 |

FOREIGN PATENT DOCUMENTS 0103873 3/1984 European Pat. Off. .
0128473 12/1984 European Pat. Off. .
0171643 2/1986 European Pat. Off. .
0206443 12/1986 European Pat. Off. .
59-224907 12/1984 Japan .

Primary Examiner—Douglas W. Olms
Assistant Examiner—Ralph E. Smith
Attorney, Agent, or Firm—Hill, Van Santen, Steadman & Simpson

[57] ABSTRACT

Circuit arrangement for digitally setting the gain factor of a digitally adjustable receive amplifier. For digitally setting the gain factor of a digitally adjustable receive amplifier independently of the reception signal, the circuit arrangement for positive and negative reception signals amplified by the gain factor has comparators whose outputs are fed back via respective feedback switching network to a comparison input of the respective appertaining comparator. As a result of the feedback switching networks the signal level at each of the comparison inputs has different comparison values which are dependent on the signal levels at the output of the respective comparator. Whenever the signal level of the reception signal exceeds one of the comparison values, a counter, that may be a non-linear counter, is decremented by one step and thereby provides a counter reading indicating the gain. After every transmitted data block, the counter is reset to the highest counter reading by a retriggerable, monostable circuit having an appropriate holding time that monitors the data block transmission by retriggering on the basis of the reception signal.

8 Claims, 1 Drawing Sheet

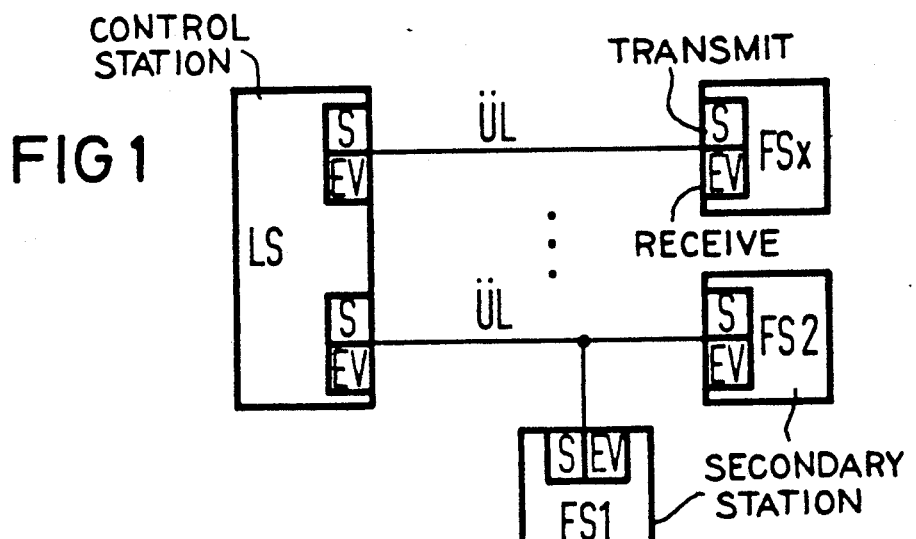
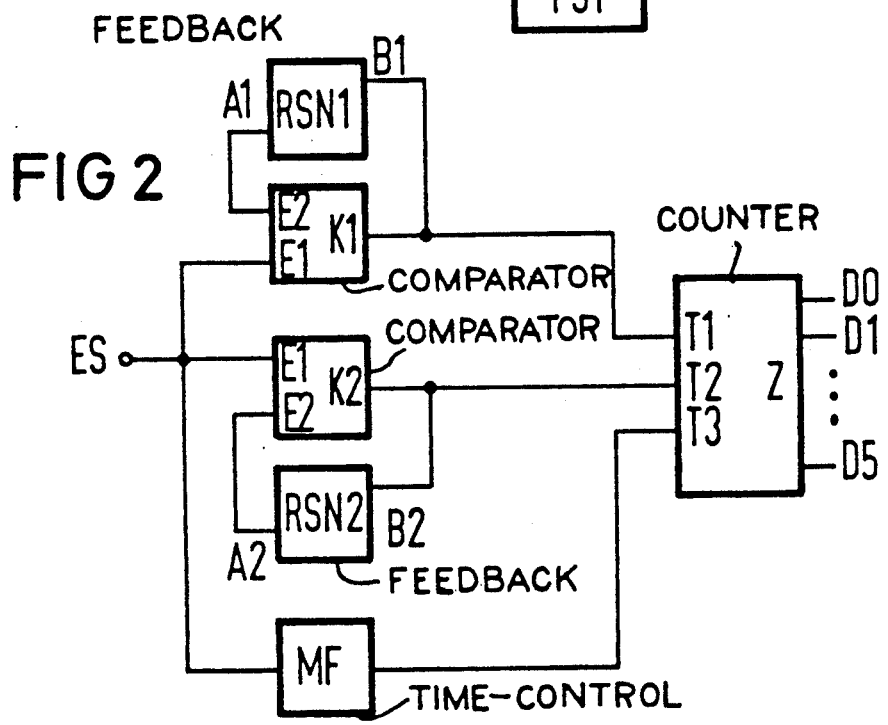
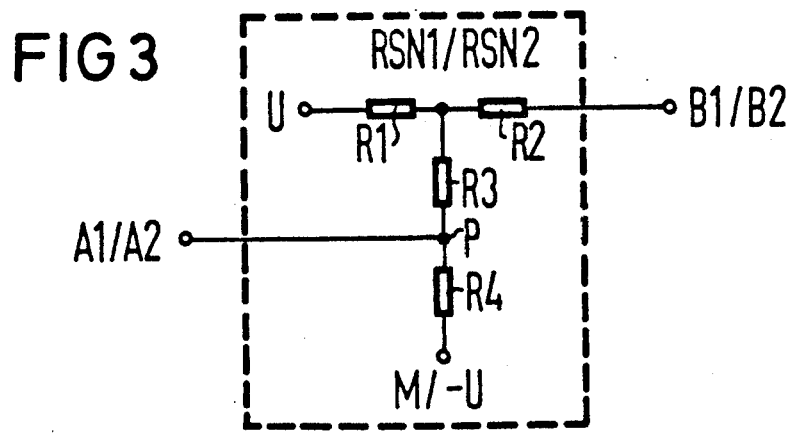

CIRCUIT ARRANGEMENT FOR DIGITALLY SETTING THE GAIN OF A DIGITALLY ADJUSTABLE RECEIVE AMPLIFIER

BACKGROUND OF THE INVENTION

The present invention is directed to a circuit arrangement for digital setting of the gain of a digitally adjustable, adaptive receive amplifier independently of a reception signal. The circuit arrangement is used in a system having at least one control station and at least one secondary station that in a block-by-block transmission of binary coded data conforming to a data transmission method wherein a pulse signal 0 is allocated to one binary value of the binary coded data and a pulse signal that alternates in operational sign is allocated to another binary value.

During data transmission between two data stations, for example a control station and a secondary station in a data station system, transmitted data can be subject to attenuation distortion. The data incoming at the data station is therefore amplified before further processing to a level that corresponds to the optimum reception level of the data station. The degree of required amplification depends on the receiving data station, on the length of the data transmission link and on the load of the data transmission link caused by other data stations connected to the data transmission link. Methods are known in the prior art for determining appropriate gain factors in a program-controlled fashion after installation or after modification of the data station system. The factors are determined either once or after every activation of a secondary station. For example, the control station repeatedly transmits test data to the secondary stations for identifying the gain factor, these secondary stations modifying their reception gains in steps until a proper reception level is determined. In a further pass, the control station again repeatedly transmits test data to which the secondary stations then reply with a return signal, whereupon the control sets its reception gain in a step-by-step procedure. Finally, the respective gain factors are stored in the secondary stations, and the respective gain factors for a respective secondary station are stored in the control station, these gained factors to be respectively set before the data transmission to a secondary station.

For amplifying the reception signals, the data stations have digitally adjustable receive amplifiers whose gain factors are identified in a program-controlled fashion as set forth above in a separate time interval which requires a great amount of control. European Patent Application EP-A-0 171 643 (corresponding to U.S. Pat. No. 4,768,204) discloses a method and an apparatus for the transmission of signals between a control station and a plurality of secondary stations that have digitally adjustable receive amplifiers and that identify the gain factors in the described procedure during a learning phase that is separately executed. The time required to identify the gain factors is then lost for useful data transmission. Thus, the data transmission rate is reduced during this time.

Since only a data block having a previously known level can be reliably received by the data stations, a local record means, which is required for service purposes and that acquires all data blocks transmitted on a data transmission link having generally different signal levels as well as signal levels that are unknown to the local record means, cannot be realized.

SUMMARY OF THE INVENTION

It is an object of the present invention to provide a circuit arrangement for digital setting of the gain factor of a digitally adjustable receive amplifier independently of the reception signal with which, first, the learning phase for setting the individual gain factors in individual data stations that requires a high degree of control is avoided and with which, second, the possibility of a local record mode for data transmission on a data transmission link is created.

In a circuit arrangement of the type initially cited, this object is inventively achieved by the following elements in the circuit arrangement: first and second comparison means having first inputs for receiving the reception signal; each having means having a feedback switching network allocated to it which is respectively located between an output and a second input of the respectively appertaining comparison means; the output of the first comparison means connected to a first clock input of a counter means and the output of the second comparison means connected to a second clock input of the counter means, the counter means having parallel outputs for indicating a counter reading; and a time-control means having an input for receiving the reception signal and having an output connected to a third clock input of the counter means. This circuit arrangement of the present invention does not set the gain factor under program control but under hardware control. It enables such a fast, automatic, digital gain control that every transmitted data block can be separately reacted to. When level changes are occurring on a data transmission link the special procedures in the prior art for identifying and setting the gain factors that are otherwise separately needed are eliminated. The local record mode on a data transmission link that is particularly advantageous for service purposes is possible at any time and at any location due to the fast reaction capability of the circuit arrangement.

The identification and setting of the gain factors occurs with reference to the 0-bytes that are already co-supplied at the beginning of every data block for bit synchronization purposes, so that no additional prefix for a data block is necessary. The end of a transmitted data block is identified with a retriggerable, monostable flip flop that provides that the respective data block that is transmitted next is received with the maximum possible gain. The use of feedback switching networks causes the switching thresholds of the comparison means to have a hysteresis characteristic. Possible existing harmonics on the reception signal are thereby prevented from leading to a premature switching of the comparison means. This is particularly important when the signal level of the reception signal is in the boundary region of the switching thresholds. One advantage of the circuit arrangement is that it can be utilized for data transmission methods that have both positive and negative pulse signals for data transmission.

Japanese Patent Application JP-A 57 162 533 discloses a circuit arrangement for digitally setting the gain factor of a digitally adjustable, adaptive receive amplifier independently of the reception signal that, like the subject matter of the present invention, combines a comparison means with a counter means. The comparison means used in the Japanese Patent Application, however, is only present once, so that this circuit arrangement is not suitable for a data transmission method wherein positive and negative pulse signals are used for data transmission. Further, a retriggerable, monostable circuit that monitors dynamic behavior on the data transmission link is not provided. In addition thereto, the comparison means does not have a feedback switching network that affects the switching threshold of the comparison means. Finally, the counter means in the prior art is clocked with a clock generator, which does not occur in the present invention.

In the circuit of the present invention, the counter means is fashioned as a non-linear counter. The time-control means has at least one retriggerable, monostable circuit. The feedback switching networks each respectively have a T-circuit constructed of resistors. The T-circuit has a longitudinal branch and a transverse branch with one end of the longitudinal branch of the T-circuit connected to a positive voltage potential terminal and the other end of this branch connected to a switching network input that receives an input signal allocated to the appertaining comparison means. The transverse branch of the T-circuit has a voltage divider constructed of two resistors having a center tap, the center tap thereof being connected to a switching network output providing an output signal to the appertaining comparison means. The transverse branch has one end connected to one of a grounded potential terminal or, to a negative potential terminal and the other end connected to the longitudinal branch.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIG. 1 is a general block diagram of a data station system having a control station and a plurality of secondary stations;

FIG. 2 is a block circuit diagram of the circuit arrangement of the present invention used in an adaptive receive amplifier in a data station of the data station system of FIG. 1; and FIG. 3 is an exemplary circuit of a feedback switching network used in the inventive circuit arrangement of FIG. 2.

DESCRIPTION OF THE PREFERRED EMBODIMENT

The data system shown in FIG. 1 has a control station LS and a plurality of secondary stations FSI through FSx that are connected to the control station LS via transmission lines ÜL. The transmission lines ÜL. can also be partly fashioned as spur lines. For example, the first secondary station FS1 is connected to the control station LS via a spur line. The control station LS and the secondary stations FS1 through FSx have receive amplifiers EV and transmitters S at the interfaces to the transmission lines ÜL. For example, the receive amplifier disclosed in European patent application EP-A-0 171 643 (U.S. Pat. No. 4,768,204 hereby incorporated by reference) is used as the receive amplifier EV.

A fault-free data transmission on the transmission lines ÜL is guaranteed when the receive amplifiers EV have the gain needed for the respective part of the transmission link. It is thereby assumed for the exemplary embodiment that the information to be transmitted is transmitted such that binary data 0 alternately supply a positive and a negative pulse signal and binary data 1 do not supply a pulse signal, whereby, however, pulse signals that have a minimum ripple such as, for example, $\sin^2 x$-shaped pulse signals, are used as pulse signals. Further, it is assumed that the transmission of the information occurs in conformity with known transmission methods in block-by-block fashion with 0-bytes for bit synchronization preceding the individual blocks. As a result of the selected transmission method, the individual 0-bits if the 0-bytes are transmitted with pulse signals that alternate in operational sign. The circuit arrangement set forth below for determining gain factors for the receive amplifiers EV utilizes this format.

A circuit arrangement of a receive amplifier EV that is the determining factor in the identification of the gain factor is depicted in FIG. 2. This circuit arrangement has two comparison means K1 and K2, each of which has a feedback switching network RSN1 and RSN2, respectively, allocated to it. The first combination of comparison means K1 and feedback switching network RSN1 is provided for a reception signal ES having a positive operational sign and the second combination of comparison means K2 and feedback switching network RSN2 is provided for a reception signal ES having a negative operational sign. The comparison means K1 and K2 compare the in-coming reception signals ES of their respective signal portion to a positive or negative signal level of a predetermined level that respectively correspond to a switching threshold. Based on the result of the comparison, the comparison means K1 and K2 produces an output signal that increments a counter means Z. The output signals thereby correspond either to a logical value 0 or to a logical value 1. The output signal logical 1 is generated by one or the other comparison means K1 or K2 when the signal level of the reception signal ES exceeds the positive or the negative comparison signal level, respectively.

To this end, the comparison means K1 and K2 each have first and second inputs E1 and E2. The reception signal ES is respectively received at the first inputs E1, whereby a respective comparison signal that corresponds to the afore-mentioned positive or negative comparison signal level is received at the second inputs E2. The reception signal ES received by the comparison means K1 and K2 has already been amplified by the received amplifier EV with a gain factor momentarily set in the receive amplifier EV.

The comparison signals supplied to the second inputs E2 of the comparison means K1 and K2 are output signals A1 and A2 of the feedback switching networks RSN1 and RSN2. The feedback switching networks RSN1 and RSN2 form these output signals from the output signals of the comparison means K1 and K2, which are supplied to the feedback networks RSN1 and RSN2 as input signals B1 and B2. The respective output signals A1 and A2 thereby have different values depending on the two possible statuses of the input signals B1 and B2. Every comparison means K1 and K2 has two different switching thresholds that form a switching hysteresis. For reasons of symmetry, the switching thresholds between the comparison means K1 and K2 do not differ in terms of levels but only in terms of operational sign.

A time-control means MF is driven with the reception signal ES in parallel with the two comparison means K1 and K2. The time-control means MF has a retriggerable, monostable circuit that, analogous to the output signals of the comparison means K1 and K2, supplies an output signal logical 1 when the holding time of the monostable circuit has expired. The holding time is set such that it is shorter than the chronological duration between two transmitted data blocks but longer than the chronological duration between two transmitted bit places of a data block. The end of every data block can be identified in this way and the gain factor for the next data block can be set to the initial value needed for setting the gain factor.

The outputs of the two comparison means K1 and K2 as well as of the time-control means MF are each connected to one of three clock inputs T1 through T3 of the counter means Z. In addition, the counter means Z has six parallel outputs D0 through D5 that are only limited to six in the exemplary embodiment. Fewer or more outputs could be utilize a needed. The plurality of outputs depends on the plurality of inputs of the receive amplifier EV employed. The six parallel outputs D0 through D5 can be used to indicate 64 counter readings of which only 16 are utilized. This is related to the plurality of bit places contained in the two 0-bytes that precede every data block for bit synchronization. The difference between the plurality of possible counter readings and the actual counter readings is meaningful when it is necessary to compensate for non-linear gain behavior of the receive amplifiers EV.

Counter readings that directly denote a gain factor are output via the parallel outputs D0 through D5. For setting the gain factor in the preferred embodiment, the counter means Z always begins with the highest counter readings and then switches to lower counter readings step-by-step depending on the input signals at the first two clock inputs T1 and T2. Other methods of counting could be used.

More specifically, the setting of the gain factor occurs in the following manner: whenever a data block is transmitted and a signal is received at the third clock input T3 of the counter mans Z via the time-control means MF after the expiration of the holding time of the monostable circuit, the counter means Z is reset to its highest counter reading. The gain is therefore set to a maximum for a newly arriving data block. Since a new data block initially arrives with the 0-byte preceding it for bit synchronization, the pulse signal of the first bit place of the first 0-byte will be maximally amplified in any case. When it is not the maximum gain that is required for the incoming data block, this pulse signal proceeds overdriven to the comparison means K1 and K2. In this case, the switching threshold of one of the two comparison means K1 or K2 is exceeded. That comparison means where the switching threshold was exceeded then generates an ouput signal that initiates the counter means Z and caused it to lower the gain factor by one step. Since this is a hardware circuit, this occurs so quickly that the pulse signal of the second bit places of the first 0-byte are now amplified only with the reduced again factor. When the switching threshold of one of the two comparison means K1 or K2 is exceeded, the gain factor is again lowered. This occurs until either the correct gain factor has been set, i.e., a switching threshold is no longer exceeded, or until the gain factor has assumed the value 0 after the pulse signal of the last bit place of the second 0-byte, i.e., after the sixteenth step. In this case, the pulse signals of the following information bits are not amplified. In any case, however, the gain factor has been correctly set as a function of the signal level of the reception signal ES before the beginning of the information bit places of a data block.

FIG. 3 depicts an exemplary circuit for the feedback switching networks RSN1 and RSN2. The fundamental circuit structure is the same for both feedback switching networks. This is formed by a T-circuit constructed of four resistors R1 through R4. The first two resistors R1 and R2 are located in a longitudinal of the T-circuit, whereas the two second resistor R3 and R4 are located in a transverse branch. A positive voltage potential terminal U is provided at one free end of the logitudinal branch having the first resistor R1 and the signal input for one of the input signals B1 or B2 (depending on whether the T-circuit forms the first feedback switching network RSN1 or the second feedback switching network RSN2) is provided at the end of the longitudinal branch having the second resistor R2. Either a grounded potential terminal M or a negative voltage potential terminal $-U$ is provided at the end of the transverse branch of the T-circuit. A center tap P that is connected to a signal output, via which one of the two output signals A1 or A2 is output, is located between the third and fourth resistors R3 and R4. The above stated description concerning the input signals B1 and B2 is analogously valid for the grounded potential terminal M or for the negative voltage potential terminal $-U$ as well as for the two output signals A1 and A2.

The dimensioning of the individual resistors depends on the selection of the voltages applied to the positive and negative voltage potential terminals U and $-U$ or on the signal levels of the input signals A1/A2 or output signals B1/B2. It is assumed for the exemplary embodiment that 5 volts are applied at the positive voltage potential terminal U and $-5$ volts are applied at the negative voltage potential terminal $-U$. It is further assumed that the input signals B1 and B2 have a signal level of 0 volts 5 volts, and that the output signals A1 and A2 respectively have a signal level of 500 mV and 700 mV or $-500$ mV and $-700$ mV depending on the input signals B1 and B2. The resistors R1 through R4 for the first feedback switching network RSN1 then, for example, have the values 270, 820, 6800 and 1200 ohms, respectively, and, for the second feedback switching network RSN2 have the values 1000, 3300, 4700 and 4700 ohms, respectively.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. Circuit arrangement for digital, reception-signal-independent setting of the gain factor of a digitally adjustable, adaptive receive amplifier in a reception part of a data station in a data station system having at least one control station and at least one secondary station that in a block-by-block transmission of binary coded data that conforms to a data transmission method wherein a pulse signal O is allocated to one bianary of the binarily coded data and a pulse signal that alternates in operational sign is allocated to the other binary value, comprising at least first and second means for comparing having respective first inputs for receiving a reception signal; each means for comparing having a feedback switching network allocated to it which is respectively located between an output and a second input of the respectively appertaining means for comparing, an output of the first means for comparing connected to a first clock input of a means for counting and an output of the second means for comparing connected to a second clock input of the means for counting, the means for counting having a plurality of parallel outputs for indicating a counter reading; and means for time-control having an input for receiving the reception signal and having an output connected to a third clock input of the means for counting.

2. The circuit arrangement according to claim 1, wherein the means for counting is a non-linear counter.

3. The circuit arrangement according to claim 1, wherein the means for time-control means has at least one retriggerable, monostable circuit.

4. The circuit arrangement according to claim 1, wherein each of the feedback switching networks is a T-circuit constructed of resistors.

5. The circuit arrangement according to claim 4, wherein each T-circuit has a longitudinal branch and a transverse branch, one end of the longitudinal branch connected to a positive voltage potential terminal and the other end of the longitudinal branch connected to a switching network input for receiving an input signal provided from an output of the appertaining comparison means; and wherein the transverse branch of the T-circuit is a voltage divider constructed of two resistors having a center tap, the center tap connected to a switching network output for providing an output signal to the appertaining means for comparing, the transverse branch having one end connected to tone of a grounded potential terminal or a negative potential terminal (−U) and another end connected to the longitudinal branch.

6. Circuit arrangement for digital, reception-signal-independent setting of the gain factor of a digitally adjustable, adaptive receive amplifier in a reception part of a data station in a data station system having at least one control station and at least one secondary station that in a block-by-block transmission of binary coded data that conforms to a data transmission method wherein a pulse signal O is allocated to one binary value of the binary coded data and a pulse signal that alternates in operational sign is allocated to the other binary value, comprising at least first and second means for comparing having respective first inputs for receiving a reception signal; each means for comparing having a feedback switching network allocated to it which is respectively located between an output and a second input of the respectively appertaining means for comparing, an output of the first means for comparing connected to a first clock input of a means for counting and an output of the second means for comparing connected to a second clock input of the means for counting, the means for counting having a plurality of parallel outputs for indicating a counter reading; and a means for time-control having an input for receiving the reception signal and having an output connected to a third clock input of the means for counting, each of the feedback switching networks being a T-circuit constructed of resistors and having a longitudinal branch and a transvese branch, one end of the longitudinal branch connected to a positive voltage potential terminal and the other end of the longitudinal branch connected to a switching network input for receiving an input signal provided from an output of the appertaining comparison means, the transverse branch of the T-circuit being a voltage divider constructed of two resistors having a center tap, the center tap connected to a switching network output for providing an output signal to the appertaining means for comparing, the transverse branch having one end connected to one of a grounded potential terminal or a negative potential terminal (−U) and another end connected to the logitudinal branch.

7. The circuit arrangement according to claim 6, wherein the means for counting is a non-linear counter.

8. The circuit arrangement according to claim 7, wherein the means for time-control means has at least one retriggerable, monostable circuit.

* * * * *